United States Patent [19]

Simpson

[11] Patent Number: 5,644,089
[45] Date of Patent: Jul. 1, 1997

[54] SYNTHETIC DIAMOND WEAR COMPONENT AND METHOD

[75] Inventor: Matthew Simpson, Arlington, Mass.

[73] Assignee: Norton Company, Worcester, Mass.

[21] Appl. No.: 439,524

[22] Filed: May 12, 1995

Related U.S. Application Data

[62] Division of Ser. No. 308,374, Sep. 19, 1994, Pat. No. 5,589,232, which is a continuation of Ser. No. 773,465, Oct. 9, 1991, Pat. No. 5,411,758.

[51] Int. Cl.$^6$ .............................. G01B 5/30; G01B 7/16; G01L 1/00; G01N 3/00
[52] U.S. Cl. ............................................. 73/760; 73/826
[58] Field of Search ............................. 73/785, 760, 826, 73/818

[56] References Cited

U.S. PATENT DOCUMENTS

| | | | |
|---|---|---|---|
| 4,567,774 | 2/1986 | Manahan et al. | 73/826 |
| 4,938,940 | 7/1990 | Hirose et al. | 427/249 |
| 4,987,002 | 1/1991 | Sakamoto et al. | 427/249 |
| 4,988,421 | 1/1991 | Drawl et al. | 427/255.7 |
| 5,096,736 | 3/1992 | Anthony et al. | 427/38 |
| 5,104,634 | 4/1992 | Calcote | 423/446 |
| 5,204,145 | 4/1993 | Gasworth | 427/577 |
| 5,259,897 | 11/1993 | Pickens et al. | 148/417 |

OTHER PUBLICATIONS

Shackelford, James F. Introduction to Materials Science for Engineers, Macmillan Publishing Co. 1988 pp. 371–374.
Anthony et al., J. Appl. Phys. 69(12), Jun. 1991, pp.8812–8125.
Matsumoto, Journal Of Materials Science letters, 4 (1985), pp.600–602.

*Primary Examiner*—George M. Dombroske
*Assistant Examiner*—Max H. Noori
*Attorney, Agent, or Firm*—Volker R. Ulbrich; Martin M. Novack

[57] ABSTRACT

A method is disclosed for making a wear component that includes providing a base surface, producing a synthetic diamond film having at least a particular equivalent strain, and applying the diamond film to the base surface. A method is also disclosed for producing synthetic diamond for use as a wear surface, by chemical vapor deposition wherein the equivalent strain of the synthetic diamond is monitored, and deposition parameters are modified when the equivalent strain of the synthetic diamond is less than a predetermined percentage.

5 Claims, 4 Drawing Sheets

SYNTHETIC DIAMOND WEAR COMPONENT AND METHOD

This is a divisional of application(s) Ser. No. 08/308,374 filed on Sep. 19, 1994 which is patented to 5,589,232 is a continuation of Ser. No. 07/773,465 filed Oct. 9, 1991 issued as U.S. Pat. No. 5,411,758 on May 2, 1995.

FIELD OF THE INVENTION

This invention relates to improvements in wear components having synthetic diamond wear surfaces and, more particularly, to improved synthetic diamond for use in wear components, to methods of making such diamond, and to methods of determining the suitability of synthetic diamond for wear applications.

BACKGROUND OF THE INVENTION

The use of natural diamond in wear components, such as in cutting and grinding tools, is very old. In addition to extreme hardness, diamond's superlative thermal conductivity, thermal stability, and inertness are unsurpassed for wear applications. In recent times synthetic polycrystalline diamond films have been successfully produced, such as by chemical vapor deposition (CVD), and used commercially in wear applications. The synthetic diamond films can be deposited directly on the base of a wear component, for example as a thin film (generally defined as a film having a thickness of less than 20 microns), or produced separately, generally as a thick film, and mounted on the base of a wear component, such as by brazing.

Even exceedingly hard diamond surfaces have a limited wear life, and the wear life of synthetic diamond, which can vary considerably for different synthetic diamond material, is a key factor in the cost-effectiveness of a wear component. A number of factors are recognized as affecting the wear life of synthetic diamond. The presence of foreign matter, voids, and cracks are all usually deleterious to the wear resistance of diamond. In this context, foreign matter also includes carbon not possessing the diamond structure, such as graphite.

It is among the objects of the present invention to provide synthetic diamond having improved wear properties, an improved method of making such diamond, and a method of determining the suitability of synthetic diamond for wear applications.

SUMMARY OF THE INVENTION

Applicant has discovered that the wear properties of synthetic diamond are related to the equivalent strain in the diamond crystal structure in an unexpected way, and this discovery is utilized in the invention to produce diamond with superior wear characteristics, as well as to monitor and modify processes of diamond deposition to obtain improved wear surfaces and wear components. [As used herein, a wear surface is intended to mean a surface employed for tribological application; for example, without limitation, a cutting surface, a grinding surface, a bearing surface or a valve surface. A wear component is intended to mean a wear surface secured to a base element; for example, without limitation, a cutting component, a grinding component, a bearing component, or a valve component.] Surprisingly, a certain minimum equivalent strain in the crystal lattice (that is, a displacement of atom positions with respect to positions they would occupy in a perfect lattice) results in improvement of the wear characteristics of synthetic diamond, rather than a degrading of wear characteristics that might be expected from lattice imperfection. In most ceramic applications, less perfect crystals exhibit poorer wear resistance.

A relatively high thermal conductivity can contribute to improvement of the wear characteristics of synthetic diamond. Applicant has demonstrated that the obtainment of diamond having substantial equivalent strain improves wear characteristics for synthetic diamond film of a given thermal conductivity. Measurements of equivalent strain can also be used in the monitoring and control of synthetic diamond film production and in selection of synthetic diamond for wear applications.

In accordance with a form of the invention, a method is set forth for making a wear component. A base surface is provided. A synthetic diamond film is produced, the film having a thickness of at least 20 microns and an equivalent strain of at least 0.08 percent. The synthetic diamond film is applied to the base surface. The film can be deposited directly on the base surface, for example by having the base surface be the target surface in a chemical vapor deposition system. More typically, for thick film synthetic diamond, the film can be separately produced and then mounted on the base surface, such as by brazing a piece of synthetic diamond film to a tungsten carbide base surface in a manner well known in the art.

It is preferable to form a diamond film wear surface having a thermal conductivity of at least about 9 W/cm°K. For thermal conductivities less than about 9 W/cm°K, the diamond film should be formed with an equivalent strain of at least about 0.10 percent to exhibit improved wear characteristics in accordance with the principles hereof.

In a further form of the invention, there is set forth a method for producing synthetic diamond film for use as a wear surface. Synthetic diamond is formed by chemical vapor deposition using initial deposition parameters. The equivalent strain of the diamond film is monitored, for example by measuring equivalent strain of each sample produced or of a sample from a produced batch. The deposition parameters are then modified when the equivalent strain of the synthetic diamond is less than a predetermined minimum percentage. In an embodiment hereof, the minimum equivalent strain percentage is about 0.08 percent. In a form of the invention, the thermal conductivity of the diamond is also measured. In this embodiment, the referenced minimum equivalent strain percentage is about 0.08 percent when the thermal conductivity is greater than about 9 W/cm°K, and the referenced minimum equivalent strain percentage is about 0.10 percent when the thermal conductivity is less than about 9 W/cm/°K. The deposition parameters to be modified include at least one parameter selected from the group consisting of the ratio of feedstock gases for chemical vapor deposition and the deposition temperature.

In accordance with a further form of the invention, a method is set forth for inspecting synthetic diamond to be utilized as a wear surface to select synthetic diamond that is expected to have superior wear properties. In accordance with this method, synthetic diamond having an equivalent strain of greater than a predetermined percentage is selected for use in certain wear application(s), whereas the synthetic diamond that does not meet the predetermined criteria (as described above) can be used for applications where the superior wear properties are not required, such as in lower cost wear components.

Further features and advantages of the invention will become more readily apparent from the following detailed description when taken in conjunction with the accompanying drawings.

DETAILED DESCRIPTION

Figure 1:
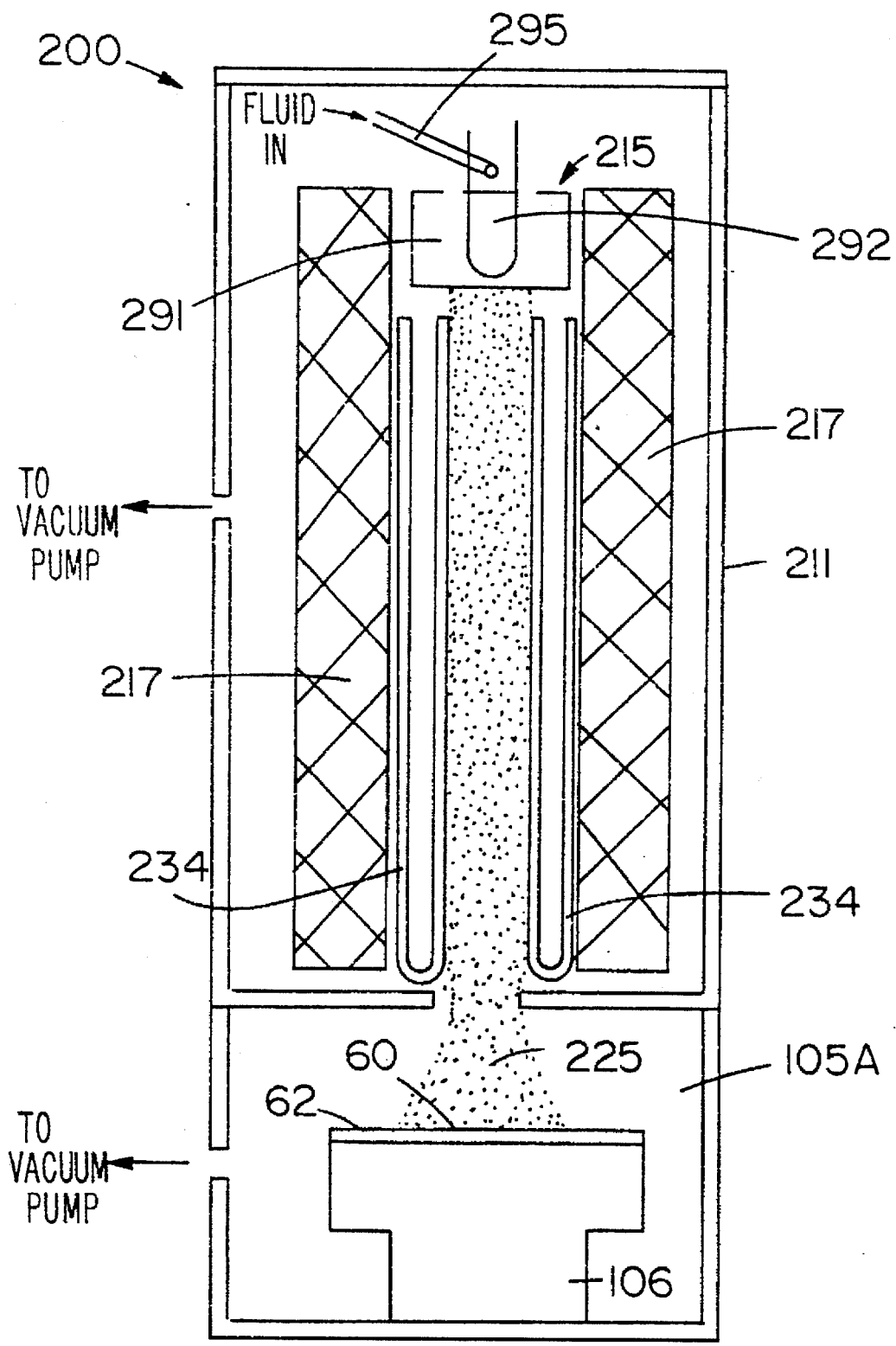
FIG. 1 is a schematic diagram of a plasma jet deposition system 200 of a type which can be utilized in practicing an embodiment of the invention.

Referring to FIG. 1, there is shown a diagram of a plasma jet deposition system 200 of a type which can be utilized in practicing an embodiment of the invention. Reference can also be made to U.S. Pat. Nos 4,471,003 and 4,487,162. The system 200 is contained within a vacuum housing 211 and includes an arc-forming section 215 which comprises a cylindrical anode 291, a rod-like cathode 292, and an injector 295 mounted adjacent the cathode so as to permit injected fluid to pass over the cathode 292. In the illustrated system the input fluid may be a mixture of hydrogen and methane. The anode 291 and cathode 292 are energized by a source of electric potential (not shown), for example a DC potential. Cylindrical magnets, designated by reference numeral 217, are utilized to control the plasma generated at the arc forming section. The magnets maintain the plasma within a narrow column until the plasma reaches the deposition region 60. Cooling coils 234, in which liquid nitrogen can be circulated, are located within the magnets and surround the focused plasma.

In operation, a mixture of hydrogen and methane is fed to the injector 295, and a plasma is obtained in front of the arc forming section and accelerated and focused toward the deposition region. The temperature and pressure at the plasma formation region are typically in the approximate ranges 1500–2700 degrees C. and 100–700 torr, respectively, and in the deposition region are in the approximate ranges 800–1100 degrees C. and 10–200 torr, respectively. As is known in the art, synthetic polycrystalline diamond can be formed from the described plasma, as the carbon in the methane is selectively deposited as diamond, and the graphite which forms is dissipated by combination with the hydrogen facilitating gas.

The bottom portion 105A of the chamber has a base 106 that can mount a medium 62 on which the synthetic diamond is to be deposited. The base can include a temperature controller. The medium 62 may be, for example, the base of a tool, an insert for a tool, the base of a bearing surface, etc. Alternatively, the medium 62 can be a substrate, such as molybdenum or graphite, on which synthetic diamond can be deposited, removed, and applied to a base to form a wear surface, such as for a tool or bearing or other wear component.

Figure 2:
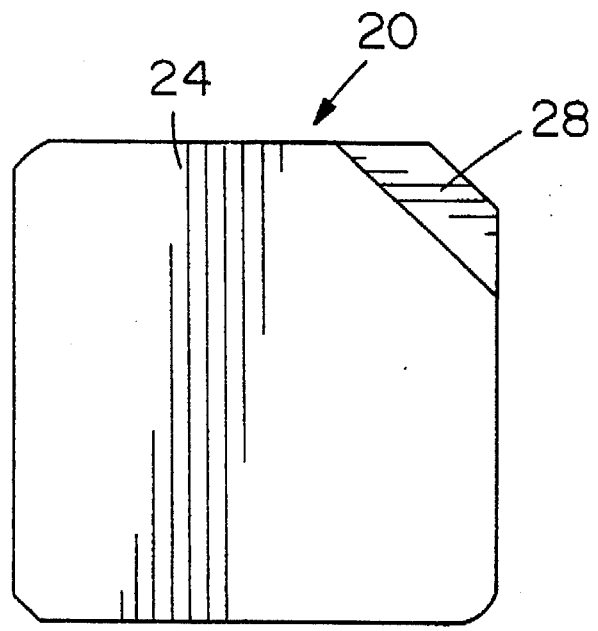
FIG. 2 is a top view of a wear component of a type typically utilized as an insert for a milling machine cutting tool.
Figure 3:
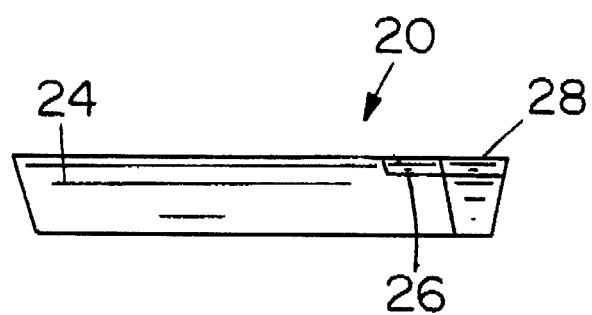
FIG. 3 is a side view of the wear component of FIG. 2.

FIGS. 2 and 3 illustrate an example of a wear component 20 of a type typically utilized as an insert for a milling machine. A tungsten carbide element or body 24 is provided in a generally rectangular shape with a chamfered corner having a depression 26 that receives a piece of diamond 28 that serves as a cutter. As is known in the art, the diamond 28 can be synthetic polycrystalline diamond film. The diamond can be deposited directly on the element 24 or, more typically for diamond thick films, a piece of synthetic diamond film that is mounted, such as by brazing, on the element 24.

In accordance with the improvement of a form of the present invention, the diamond wear surface comprises a polycrystalline synthetic diamond thick film (i.e. a film at least 20 microns thick) having an equivalent strain of at least 0.08 percent. For thick film synthetic diamond wear surfaces having a thermal conductivity greater than about 9 W/cm°K the equivalent strain should be at least about 0.08 percent to obtain superior wear characteristics. When the thermal conductivity is less than about 9 W/cm/°K, an equivalent strain of at least about 0.10 percent is needed to provide the desired superior wear characteristics. The relationship between equivalent strain and wear properties is particularly significant at substantial thick film thicknesses, viz. greater than about 200 microns.

As is known in the art, certain operating parameters of the plasma jet deposition equipment, or of other chemical vapor deposition equipments, are generally adjustable, such as by varying the ratio of feedstock gases (for example, the relative percentages of hydrogen and methane), varying the temperature, and/or varying the pressure of the plasma and/or the target (e.g. the medium 62 in FIG. 1). In accordance with an aspect of the present invention, operating conditions are adjusted to obtain the desired minimum equivalent strain percentage. Increasing the deposition temperature tends to increase equivalent strain.

In an embodiment hereof, equivalent strain is measured as follows: X-ray diffraction measurements are made using Cu ka radiation (45 kV, 40 mA on the tube) on a Philips PW1700 X-ray diffraction analyzer machine. The patterns are recorded for the diamond as grown (i.e. without crushing). The angle 2θ is scanned in 0.04 degree steps, dwelling 1 second at each step. Data are corrected in a standard manner using the Philips program provided for the user of the machine. In particular, a correction using the Lorentz polarization factor is made and the ka2 peaks are stripped assuming the ka2/ka1 ratio is 0.5. Instrument broadening is estimated using 5–10 um diamond powder as a standard. Finally, the integral breadth d of the 331 reflection is measured and the equivalent strain e computed from it assuming all of the broadening is induced by strain, using the formula $$d = (e/4) \tan \theta$$

where θ is the usual diffraction angle, that is, 70.2 degrees for the 331 reflection. [See H. P. Klug, L. A. Alexander "X-ray Diffraction Procedures for Polycrystalline and Amorphous Materials", p661, Wiley-Interscience, New York, 1974.] The technique of measurement of equivalent strain is not, of itself, an inventive feature hereof, and it will be understood that any suitable technique for determining equivalent strain can be used, consistent with the principles of the invention.

It is known that an increase in the thermal conductivity can be achieved in CVD diamond by varying the chemistry of the depositing gas. For example, additions of oxygen and reductions in carbon content are both known methods of increasing thermal conductivity of CVD diamond. Thermal conductivity in an embodiment hereof is measured by a method described in Enguhard et al, Materials Science & Engineering, Volume B5, pp. 127–134 (1990).

Figure 4:
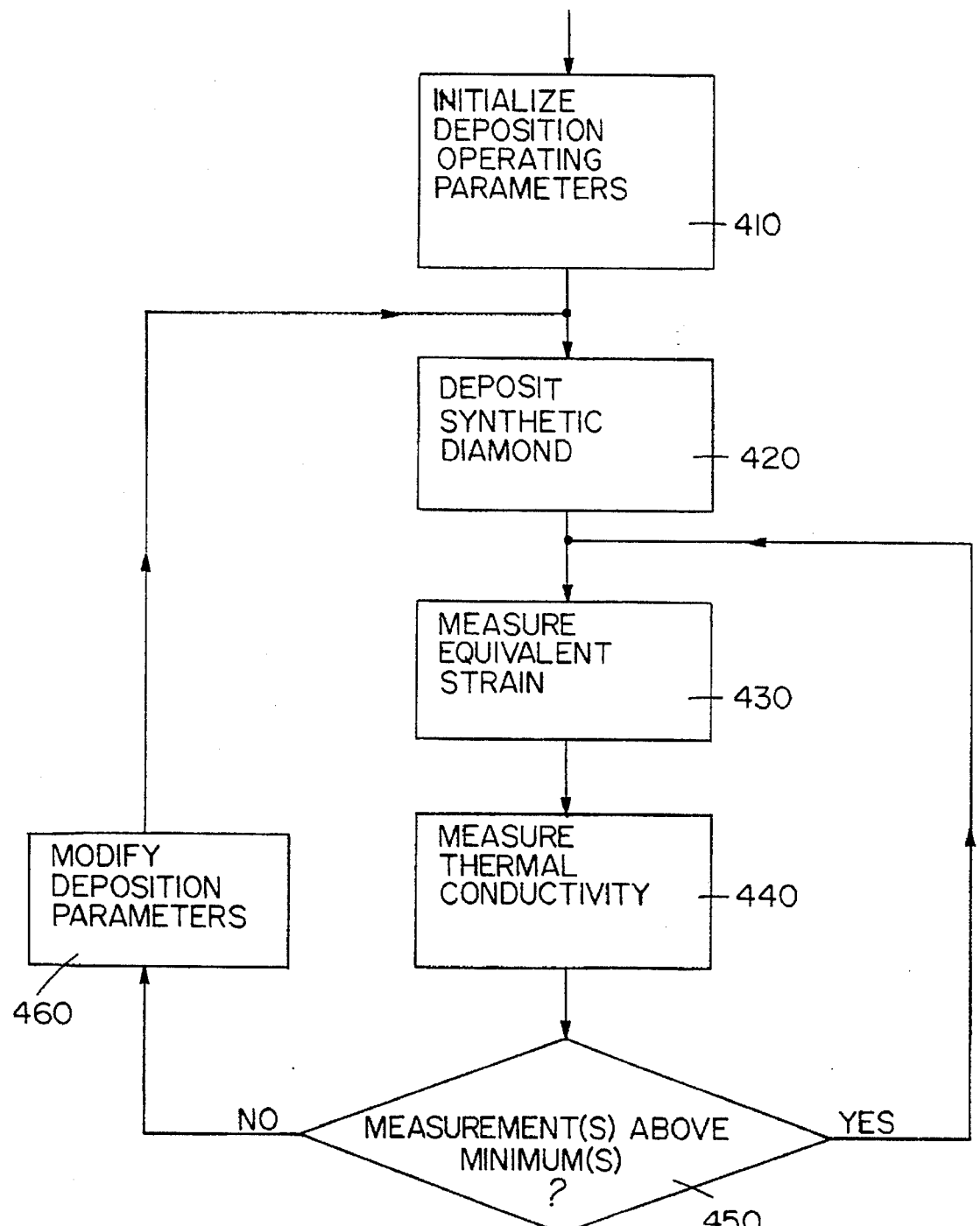
FIG. 4 is an operational flow diagram of a procedure in accordance with an embodiment of the invention for producing synthetic diamond having improved wear characteristics.

FIG. 4 is an operational flow diagram of a procedure in accordance with an embodiment of the invention for producing synthetic diamond having improved wear characteristics. The block 410 represents the initializing of deposition operating parameters, for example the operating parameters of the FIG. 1 arc jet plasma deposition equipment. These parameters may include, inter alia, the ratio of feedstock gases, the control of temperature, and the control of pressure. The block 420 represents the deposition of synthetic diamond, and the block 430 represents the measurement of the equivalent strain of the synthetic diamond. The thermal conductivity of the synthetic diamond can also be measured, as represented by the block 440. If the measured equivalent strain percentage is below a predetermined threshold (which, as noted above, may also take into account the thermal conductivity, a decision is made (represented by decision block 450) to modify the deposition parameters. For example, the deposition temperature can be raised, which tends to increase the equivalent strain of the resultant CVD diamond. Also, the percentage of methane in the feedstock gases can be decreased, if necessary, to increase the thermal conductivity of the resultant CVD diamond. When the equivalent strain is above the desired minimum, the process can be periodically monitored, as represented by re-entry to the block 420.

Figure 5:
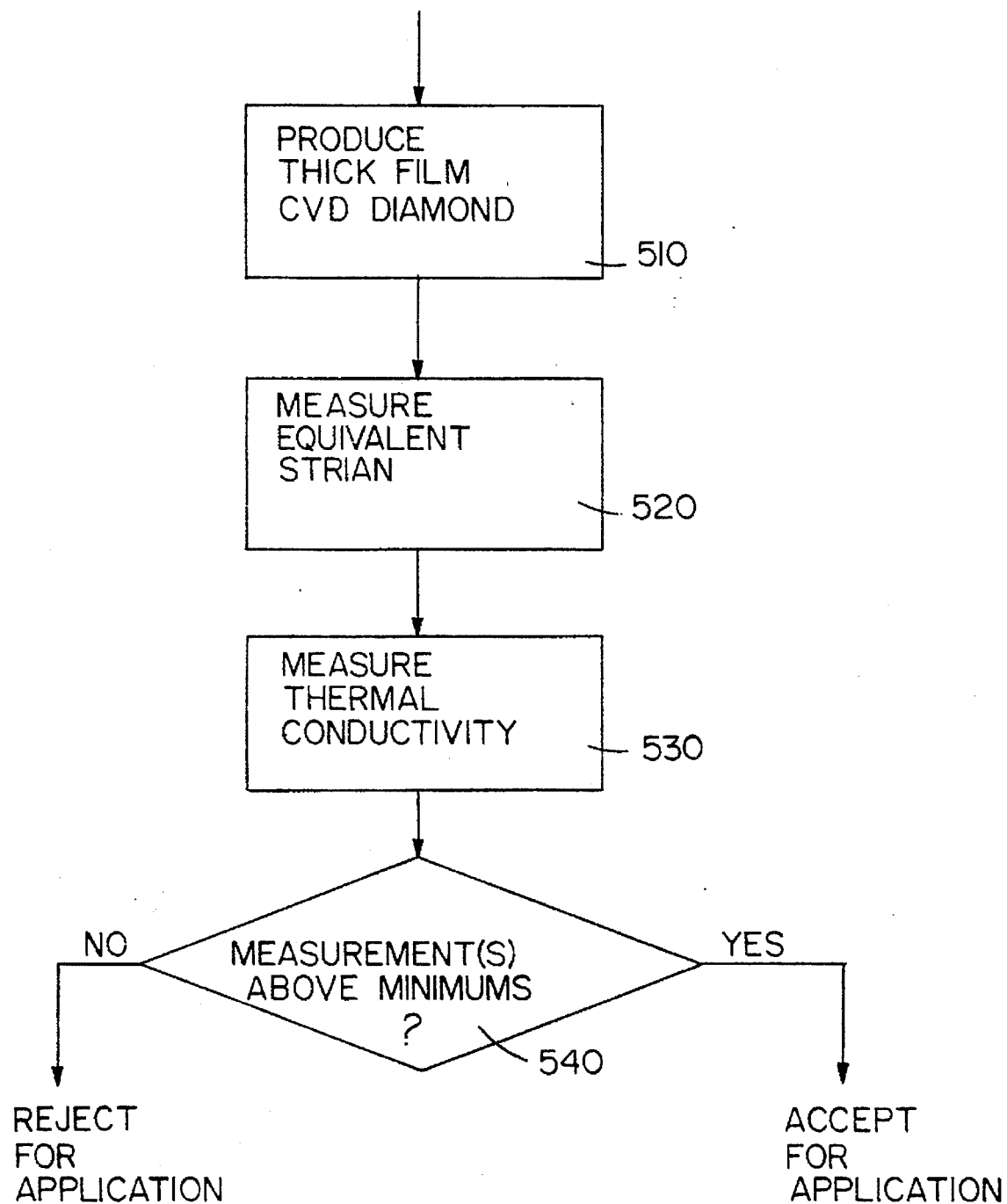
FIG. 5 is an operational flow diagram of a procedure of the invention for selecting synthetic diamond based on suitability for wear applications.

In accordance with a further aspect of the invention, and as represented by the operational flow diagram of FIG. 5, measurement of equivalent strain is utilized in selecting diamond samples (or selecting batches or production runs from which samples are taken) for suitability in wear applications. Diamond samples (or runs or batches) which do not meet equivalent strain criteria can be used in applications where some compromise in wear properties may be acceptable, such as in lower cost wear components. The block 510 represents the production of thick film polycrystalline diamond. The block 520 represents the performance of testing for equivalent strain on a sample of the produced polycrystalline synthetic diamond. Thermal conductivity can also be measured, as represented by block 530. If the measured equivalent strain percentage is above a predetermined threshold (which, as noted above, may also take into account the thermal conductivity), the diamond can be accepted for a particular wear surface application or, conversely, rejected for such application (decision block 540).

EXAMPLES

Equipment of the type shown in FIG. 1, but without cooling coils, was utilized to produce synthetic diamond samples that were subjected to a number of wear tests. The tests performed on the samples were as follows:

Milling Test

The diamond sample, at least 250 um thick, is ground flat and parallel within 10 um, and polished on one side. The sample is then mounted with the finest grains uppermost by brazing on a tungsten carbide insert as illustrated in FIGS. 2 and 3. The insert is mounted as a single tooth in a vertical spindle mill running at 1500 m/min. with an infeed of 0.25 mm/rev. and 1 mm depth of cut for a single tooth. The workpiece diameter is 100 mm. Performance is determined by implementing 100 passes of the tool head over a continuous cast A390 aluminum alloy workpiece and measuring the wear on the insert using a toolmaker's microscope.

Sandblast Test

The side of the sample that was in contact with the substrate is blasted with 120 grit SiC flowing at a rate of about 3 g/min. Air pressure is about 80 psig and the nozzle size is about 0.7 mm. Performance is determined by blasting for 25 minutes at a standoff of 2 cm and measuring the depth of the pit so formed in um.

Example 1

Samples 1-1 and 1-2 were produced using the following conditions of the DC arc jet plasma deposition equipment

|  | Sample 1–1 | Sample 1–2 |
| --- | --- | --- |
| Gas enthalpy | 40.8 kJ/g | 40.7 kJ/g |
| % CH4 in H2 | 0.16 | 0.16 |
| Pressure | 20 Torr | 20 Torr |
| Deposition temp. | 1050 C. | 1050 C. |

The samples were measured and tested to determine equivalent strain thermal conductivity, and milling wear, using the measurements and tests first described above. The results were as follows:

|  | Sample 1–1 | Sample 1–2 |
| --- | --- | --- |
| Eq. strain | .13 | .08 |
| Thermal cond. | 5.8 W/cm °K. | 5.3 W/cm °K. |
| Milling wear | .0077 in. | .0121 in. |

It is seen from this example that two materials made under similar conditions can have substantially differences in equivalent strain. The material with higher equivalent strain exhibited much better performance in the milling test. Specifically, the sample 1-2 had about 57% more wear than the sample 1-1.

Example 2

Samples 2-1 and 2-2 were produced using the following conditions of the DC arc jet plasma deposition equipment

|  | Sample 2–1 | Sample 2–2 |
| --- | --- | --- |
| Gas enthalpy | 178 kJ/g | 170 kJ/g |
| % CH4 in H2 | 0.2 | 0.35 |
| Pressure | 4.5 Torr | 2.9 Torr |
| Deposition temp. | 900 C. | 1050 C. |

The samples were measured and tested to determine equivalent strain, thermal conductivity and sandblast test performance, using the measurements and tests first described above. In this Example (only) thermal conductivity was measured using a method more suitable for smaller samples, and described in Frederikse et al., Applied Optics, V27, pp. 4672–4675 (1988). The results were as follows:

|  | Sample 2–1 | Sample 2–2 |
| --- | --- | --- |
| Eq. strain | <0.03 | .12 |
| Thermal cond. | 3.7 W/cm °K. | 4.5 W/cm °K. |
| Sandblast pit depth | 85 um | 65 um |

The sample 2-1, made at substantially lower deposition temperature than sample 2-2 or the samples of Example 1, exhibited much lower equivalent strain than the other samples. Again, the sample with lower equivalent strain (2-1) exhibited greater wear; viz., about 30% deeper pit depth than sample 2-2. The lower pressure in making sample 2-2 is believed to have contributed to this sample having a higher thermal conductivity notwithstanding the lower percentage of methane used in making sample 2-1.

Example 3

Samples 3-1 and 3-2 were produced using the following conditions of the DC arc jet plasma deposition equipment

|  | Sample 3-1 | Sample 3-2 |
| --- | --- | --- |
| Gas enthalpy | 46 kJ/g | 41 kJ/g |
| % CH4 in H2 | 0.07 | 0.17 |
| Pressure | 20 Torr | 10 Torr |
| Deposition temp. | 1050 C. | 1050 C. |

The samples were measured and tested to determine equivalent strain, thermal conductivity and milling wear, using the measurements and tests first described above. The results were as follows:

|  | Sample 3-1 | Sample 3-2 |
| --- | --- | --- |
| Eq. strain | .099 | .093 |
| Thermal cond. | 11.0 W/cm °K. | 7.0 W/cm °K. |
| Milling wear | .0073 in. | .0099 in. |

In this example the samples differ mainly in thermal conductivity and, as expected, the material having substantially higher thermal conductivity performed considerably better in the milling wear test. Sample 3-2 had about 35% more wear than sample 3-1.

Example 4

Samples 4-1 and 4-2 were produced using the following conditions of the DC arc jet plasma deposition equipment

|  | Sample 4-1 | Sample 4-2 |
| --- | --- | --- |
| Gas enthalpy | 34 kJ/g | 35 kJ/g |
| % CH4 in H2 | 0.081 | .088 |
| Pressure | 10 Torr | 10 Torr |
| Deposition temp. | 900 | 1050 C. |

The samples were measured and tested to determine equivalent strain, thermal conductivity and milling wear using the measurements and tests first described above. The results were as follows:

|  | Sample 4-1 | Sample 4-2 |
| --- | --- | --- |
| Eq. strain | .042 | .17 |
| Thermal cond. | 12 W/cm °K. | 8.5 W/cm °K. |
| Milling wear | .0113 in | .0085 in |

This example shows two materials with thermal conductivities greater than 8.5 W/cm K and differing equivalent strains. The sample with lower equivalent strain (4-1) exhibited about 33% more milling wear.

In summary, the invention, in its various aspects, has been based upon the surprising discovery that synthetic diamond films having at least a certain equivalent strain percentage have substantially better wear properties than seemingly more "perfect" synthetic diamond films having a lower equivalent strain percentage.

The invention has been described with reference to particular preferred embodiments, but variations within the spirit and scope of the invention will occur to those skilled in the art. For example, it will be understood that other types of chemical vapor deposition, such as microwave plasma deposition or hot filament deposition, can be utilized to produce synthetic diamond film.

I claim:

1. A method of investigating synthetic diamond to be utilized as wear surface to select synthetic diamond having superior wear properties, comprising the steps of:

measuring the equivalent strain of the synthetic diamond; and selecting diamond having an equivalent strain greater than a predetermined percentage.

2. The method as defined by claim 1, wherein said predetermined equivalent strain percentage is at least about 0.08 percent.

3. The method as defined by claim 1, further comprising measuring the thermal conductivity of said diamond, and selecting diamond having a thermal conductivity of at least 9 W/cm°K and an equivalent strain of at least 0.08 percent.

4. The method as defined by claim 2, further comprising measuring the thermal conductivity of said diamond, and selecting diamond having a thermal conductivity of at least 9 W/cm°K and an equivalent strain of at least 0.08 percent.

5. The method as defined by claim 4, further comprising measuring the thermal conductivity of said diamond, and selecting diamond having a thermal conductivity of less than 9 W/cm°K and an equivalent strain of at least 0.10 percent.

* * * * *